(«12) United States Patent
Pan et al.

(10) Patent No.: US 9,356,616 B1
(45) Date of Patent: May 31, 2016

(54) PIPELINED INTERPOLATING SUB-RANGING SAR ANALOG-TO-DIGITAL CONVERTER

(71) Applicant: Broadcom Corporation, Irvine, CA (US)

(72) Inventors: Hui Pan, Coto de Caza, CA (US); Xin Jin, Irvine, CA (US); Chia-Jen Hsu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/816,387

(22) Filed: Aug. 3, 2015

Related U.S. Application Data

(60) Provisional application No. 62/098,328, filed on Dec. 30, 2014.

(51) Int. Cl.
| | | |
|---|---|---|
| *H03M 1/14* | (2006.01) | |
| *H03M 1/44* | (2006.01) | |
| *H03M 1/46* | (2006.01) | |
| *H03M 1/12* | (2006.01) | |

(52) U.S. Cl.
CPC ............ *H03M 1/462* (2013.01); *H03M 1/1245* (2013.01); *H03M 1/141* (2013.01); *H03M 1/145* (2013.01); *H03M 1/445* (2013.01)

(58) Field of Classification Search
None
See application file for complete search history.

(56) References Cited

U.S. PATENT DOCUMENTS 8,207,882 B1 *  6/2012  Jennings ............... H03M 1/141
                                              341/155
8,836,553 B2 *  9/2014  Zhang .................. H03M 1/1009
                                              341/120

OTHER PUBLICATIONS

Steen-Hansen, E. et al., Modeling and Design of a Dual-Residue Pipelined ADC in 130 nm CMOS, Nov. 2012, IEEE, NORCHIP 2012, pp. 1-4, INSPEC Accession No. 13247395.*
Vecchi et al. An 800 MS/s Dual-Residue Pipeline ADC in 40 nm CMOS, IEEE Journal of Solid-State Circuits, vol. 46, No. 12, Dec. 2011.*
Pengcheng Yan et al., IOB 25 MS/S Pipelined SAR ADC With Dual-Phase Zero-Crossing Detector, IEEE Oct. 2014, 12th IEEE International Conference on Solid-State and Integrated Circuit Technology.*
Hegong Wei et al. An 8-b 400-MS/s 2-b-Per-Cycle SAR ADC With Resistive DAC, IEEE Journal of Solid-State Circuits, vol. 47, No. 11, Nov. 2012.*
Hurrell, Christopher Peter, et al., An 18 b 12.5 MS/s ADC With 93 dB SNR, Dec. 2010, pp. 2647-2654, vol. 45, No. 12, IEEE Journal of Solid-State Circuits, Piscataway, New Jersey.
Chan, Chi-Hang, et al., A 3.8mW 1GS/s 2b/cycle Interleaving SAR ADC with Compact DAC Structure, pp. 1-2, Jun. 13-15, 2012, 2012 Symposium on VLSI Circuits, Honolulu, Hawaii.

* cited by examiner

*Primary Examiner* — Howard Williams
(74) *Attorney, Agent, or Firm* — Brinks Gilson & Lione

(57) ABSTRACT

A multi-bit per cycle successive approximation register (SAR) analog-to-digital converter (ADC) may sample an input signal, successively approximate the sampled signal with a shrinking sub-range containing the signal, and output coarse digital codes corresponding to the sub-range. A sub-ranging stage may continue quantization over the sub-range by sampling and interpolating between a pair of zero crossing signals that bound the sub-range. The zero crossing signals may be taken from the SAR preamp output. The sub-ranging process may be pipelined recursively in multiple stages to increase throughput and efficiency.

20 Claims, 4 Drawing Sheets

PIPELINED INTERPOLATING SUB-RANGING SAR ANALOG-TO-DIGITAL CONVERTER

PRIORITY CLAIM

This application claims priority to U.S. Provisional application No. 62/098,328, filed 30 Dec. 2014, which is entirely incorporated by reference.

TECHNICAL FIELD

This disclosure relates to analog-to-digital conversion. This disclosure also relates to sub-ranging in multiple-bit successive-approximation-register analog-to-digital converters.

BACKGROUND

High speed data networks form part of the backbone of what has become indispensable worldwide data connectivity. Within the data networks, network devices such as switching devices direct data packets from source ports to destination ports, helping to eventually guide the data packets from a source to a destination. Improvements in signal conversion performance, including improvements in analog-to-digital conversion accuracy and speed, will further enhance performance of data networks.

DETAILED DESCRIPTION

The discussion below relates to an analog-to-digital converter (ADC). The ADC may include a multi-bit successive approximation register (SAR) ADC. The multi-bit SAR ADC may be used to generate multiple zero-crossing (ZX) signals of an input voltage in a multi-bit ZX SAR ADC (MZADC) architecture. The quantization precision may be increased over the SAR ADC by interpolating the ZX signals to reduce the sub-range of the SAR circuitry within the MZADC architecture. Multiple interpolation iterations may be pipelined to obtain a target system resolution and throughput.

Figure 1:
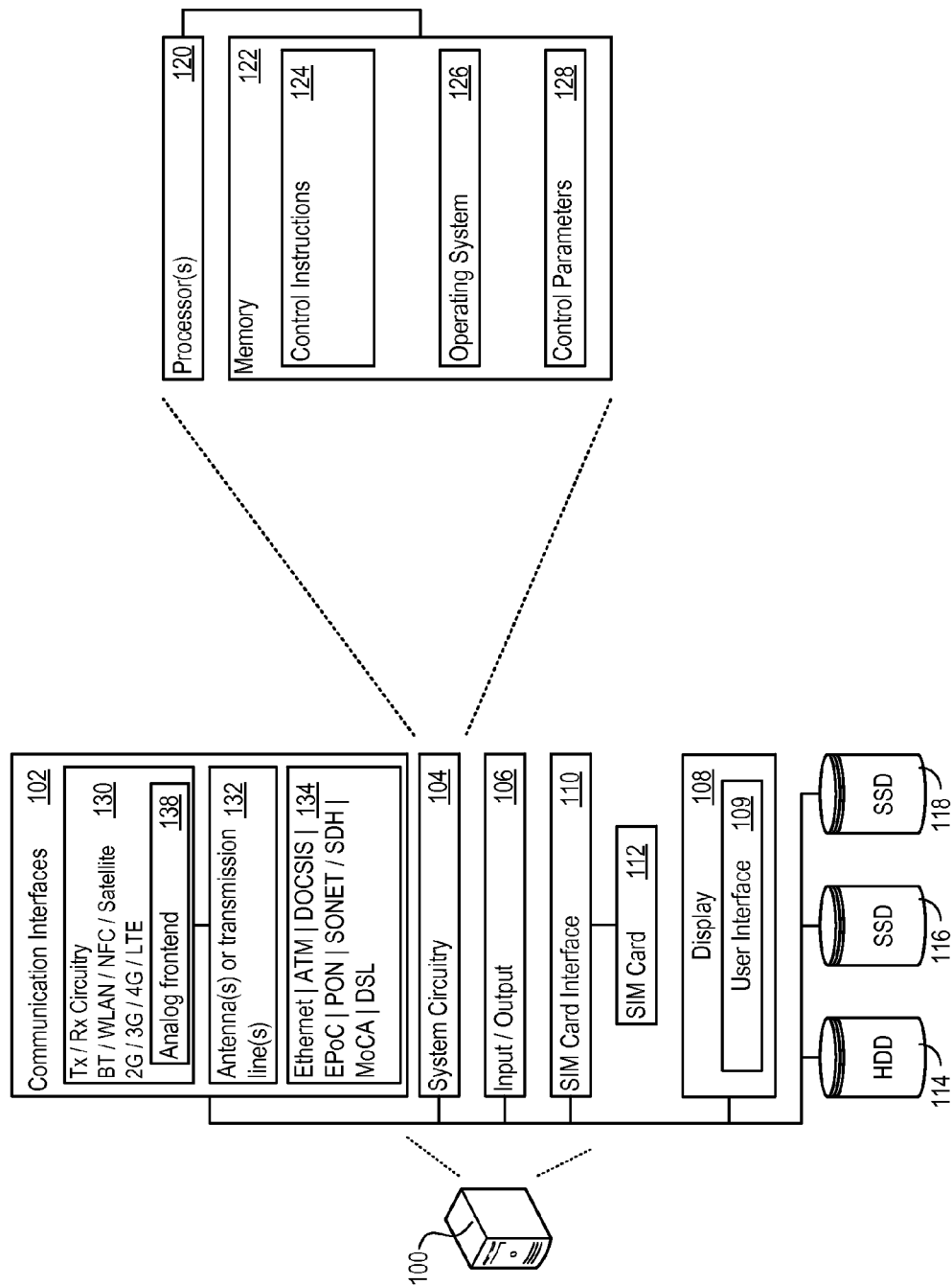
FIG. 1 shows an example device.

FIG. 1 shows an example device 100. The device 100 may be any of a wide range of devices, such as a communication device, such as a peripheral, smart phone, or client or server computer; a network device such as a switch, router, backbone networking hardware, or hub; a networked automotive device; a gaming console; a television set-top box; a laptop computer; a 10M/100M/1G/10G or other Ethernet device, a serializer/deserializer (SerDes) device, or other device. For example, the device 100 may be any device that includes analog to digital conversion (ADC) functions, for instance using the MZADC architecture described below in connection with, e.g., time-interleaving and/or pipelining for analog-to-digital (ND) conversion.

To provide some context for the discussion below, FIG. 1 shows an example device 100 that may implement the MZADC architecture and techniques. In FIG. 1, the device 100 includes one or more communication interfaces 102, system circuitry 104, input/output interfaces 106, and a display 108 on which the device 100 generates a user interface 109. The communication interfaces 102 may include transmitters and receivers ("transceivers") 130 and any antennas or transmission lines 132 connected to the transceivers 130. The analog frontend 138 may include amplifiers configured to adjust input signal levels to meet predefined criteria or characteristics (e.g., amplitude). The analog frontend 138 may further include filters; mixers; ADCs, such as MZADCs; and/or other circuitry. The transceivers 130 may provide physical layer interfaces for any of a wide range of communication protocols 134, such as any type of Ethernet, data over cable service interface specification (DOCSIS), digital subscriber line (DSL), multimedia over coax alliance (MoCA), or other protocol. When the communication interfaces 102 support cellular connectivity, the device 200 may also include a subscriber identity module (SIM) card interface 110 and SIM card 112. The device 100 also includes storage devices, such as hard disk drives 114 (HDDs) and solid state disk drives 116, 118 (SDDs).

The user interface 109 and the input/output interfaces 106 may include a graphical user interface (GUI), touch sensitive display, voice or facial recognition inputs, buttons, switches, speakers and other user interface elements. Additional examples of the input/output interfaces 106 include microphones, video and still image cameras, headset and microphone input/output jacks, Universal Serial Bus (USB) connectors, memory card slots, and other types of inputs. The input/output interfaces 106 may further include magnetic or optical media interfaces (e.g., a CDROM or DVD drive), serial and parallel bus interfaces, and keyboard and mouse interfaces.

The system circuitry 104 may include any combination of hardware, software, firmware, or other logic. The system circuitry 104 may be implemented, for example, with one or more systems on a chip (SoC), application specific integrated circuits (ASIC), discrete analog and digital circuits, and other circuitry. The system circuitry 104 is part of the implementation of any desired functionality in the device 100 . . . .

As just one example, the system circuitry 104 may include one or more processors 120 and memories 122. The memory 122 and storage devices 114, 116 store, for example, control instructions 124 and an operating system 126. The processor 120 executes the control instructions 124 and the operating system 126 to carry out any desired functionality for the device 100. The control parameters 128 provide and specify configuration and operating options for the control instructions 124, operating system 126, and other functionality of the device 100.

The transceivers 130 may provide physical layer interfaces for any of a wide range of communication protocols 134, such as any type of Ethernet, data over cable service interface specification (DOCSIS), digital subscriber line (DSL), multimedia over coax alliance (MoCA), or other protocol. When the communication interfaces 102 support cellular connectivity, the device 100 may also include a subscriber identity module (SIM) card interface 110 and SIM card 112. The device 200 also includes storage devices, such as hard disk drives 114 (HDDs) and solid state disk drives 116, 118 (SDDs).

The MZADC architecture described below may be used to implement, in any device, a single-channel digital-calibration-free 10-bit 750-mega-sample-per-second ADC, in, e.g., a 28 nanometer complementary metal-oxide semiconductor (CMOS) fabrication process.

Figure 2:
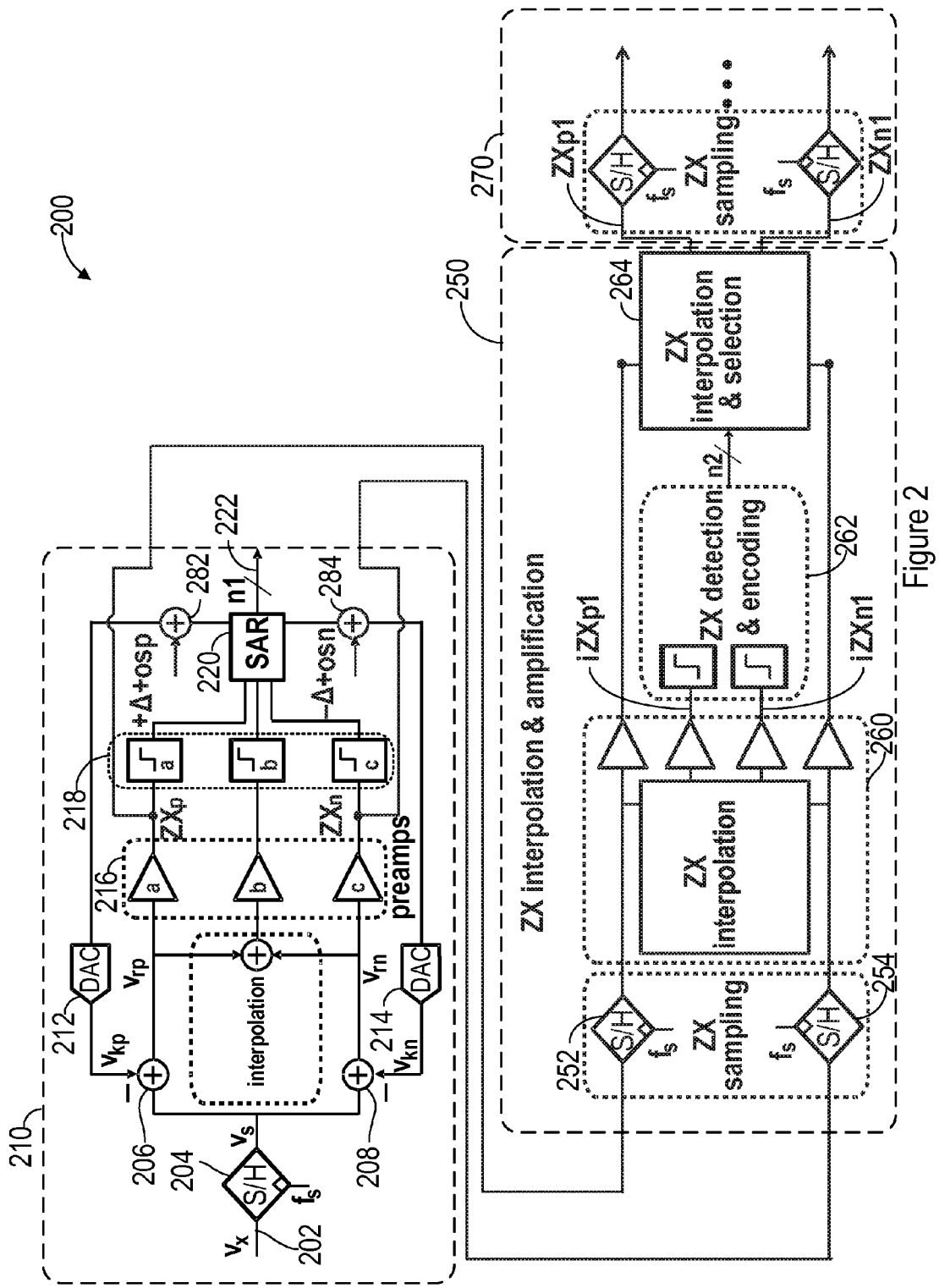
FIG. 2 shows an example multiple-bit zero-crossing successive approximation register analog-to-digital converter (MZADC).

FIG. 2 shows an example MZADC 200. In the example MZADC 200, a voltage input $V_x$ is supplied to a SAR ADC stage 210 at input 202. A sample and hold (SH) circuit 204 may sample and hold the input voltage to produce the sampled voltage $V_s$. The MZADC 200 may hold $V_s$ constant for a time based on the sampling frequency, $f_s$, of the system. $f_s$ may be supplied as an input to SH circuit 204. $V_s$ may be combined, e.g., subtractively combined, with voltages $V_{kn}$ and $V_{kp}$ at combiners 206, 208. The voltages $V_k$ correspond to the quantization thresholds for the $k^{th}$ conversion cycle of the SAR ADC 210. The combined voltages $V_{rp}$ and $V_{rn}$ are the residues from the sampled input $V_s$ once the threshold values are removed from $V_s$.

The threshold values may be digital values supplied to digital-to-analog converters (DACs) 212, 214 to produce $V_{kn}$, $V_{kp}$. For the first iteration (k=1), the threshold voltages ($V_{kn}$, $V_{kp}$) may be selected from those that evenly divide the full-scale (FS) range for the MZADC. For example, for a 2-bit per cycle SAR ADC stage 210, digital threshold values '11' and '01' may be input into the DACs 212, 214. However, other resolutions per cycle may be used, for example, 1.5, 3, or other bit depths. Interpolation, for example, resistive or capacitive interpolation, may be used to produce intermediate threshold values between $V_{kp}$ and $V_{kn}$ to increase the bit depth for a conversion cycle of the SAR ADC stage 210. A preamp system 216 and comparator/latch system 218 may be used for zero-crossing (ZX) generation/amplification and detection, respectively. In the example MZADC three ZX signal paths are shown, and three preamps 216a, 216b, and 216c, and three latch/comparators 218a, 218b, and 218c are used. However, virtually any number of parallel ZXs is possible. In some cases, parameters such as ADC speed and architectural complexity may guide the selection of the number of parallel ZX paths.

The SAR circuitry 220 may register the bits resolved in a SAR conversion cycle and provide bits (e.g., n1 bits) as coarse output 222 at the end of the SAR iterations.

The SAR preamp output zero crossing signals, ZXp and ZXn, may be tapped as input to the sub-ranging circuitry 250 of the MZADC 200 after the last conversion cycle of the SAR ADC stage 210. The sub-ranging circuitry 250 may feed the zero crossing inputs to the SH circuits 252, 254. The sampled zero crossings may be interpolated using interpolation circuitry 260 to generate fine zero-crossings. For example, resistive and/or capacitive circuitry may be used to generate interpolated values between ZXp and ZXn. The interpolated zero crossings may be detected through the latch/comparator circuitry 262 to generate the fine bits on top of those coarse SAR output 222.

The bit output of the sub-ranging stage 250 may also be used to generate a pair of zero crossings that bound $V_s$ further for application in recursive sub-ranging. The ZX interpolation and selection circuitry 264 in the sub-ranging circuitry 250 may be used for to perform this bounding. The generated zero crossings ZXp1, ZXn1 may be used as input to the recursion circuitry 270, which may provide SHs to sample the input ZXs.

The recursive sub-ranging processing may be pipelined in multiple stages to produce increasing precision (e.g., ZXp2, ZXn2, ...) in the zero crossings that bound the sampled input signal $V_s$. This increases the MZADC resolution without degrading the throughput.

Over-ranges (Δ) and offset corrections (osp, osn) may be digitally injected via the DAC 212, 214 inputs to adjust the $V_k$ values to overcome comparator offsets and DAC incomplete settling in the SAR ADC stage 210. The over-ranges may expand the sub-range by a known amount to ensure that Vs falls within the bound set by the sub-ranging input ZXs. The offset calibration values (osp, osn) may be injected to correct for relative skew between the ZX signal paths in the SAR stage 210. In some implementations, the sub-raging stages (250, 270, ...) are assumed to be much more precise than the SAR stage 210 and may be used as reference to calibrate out the offsets.

Figure 3:
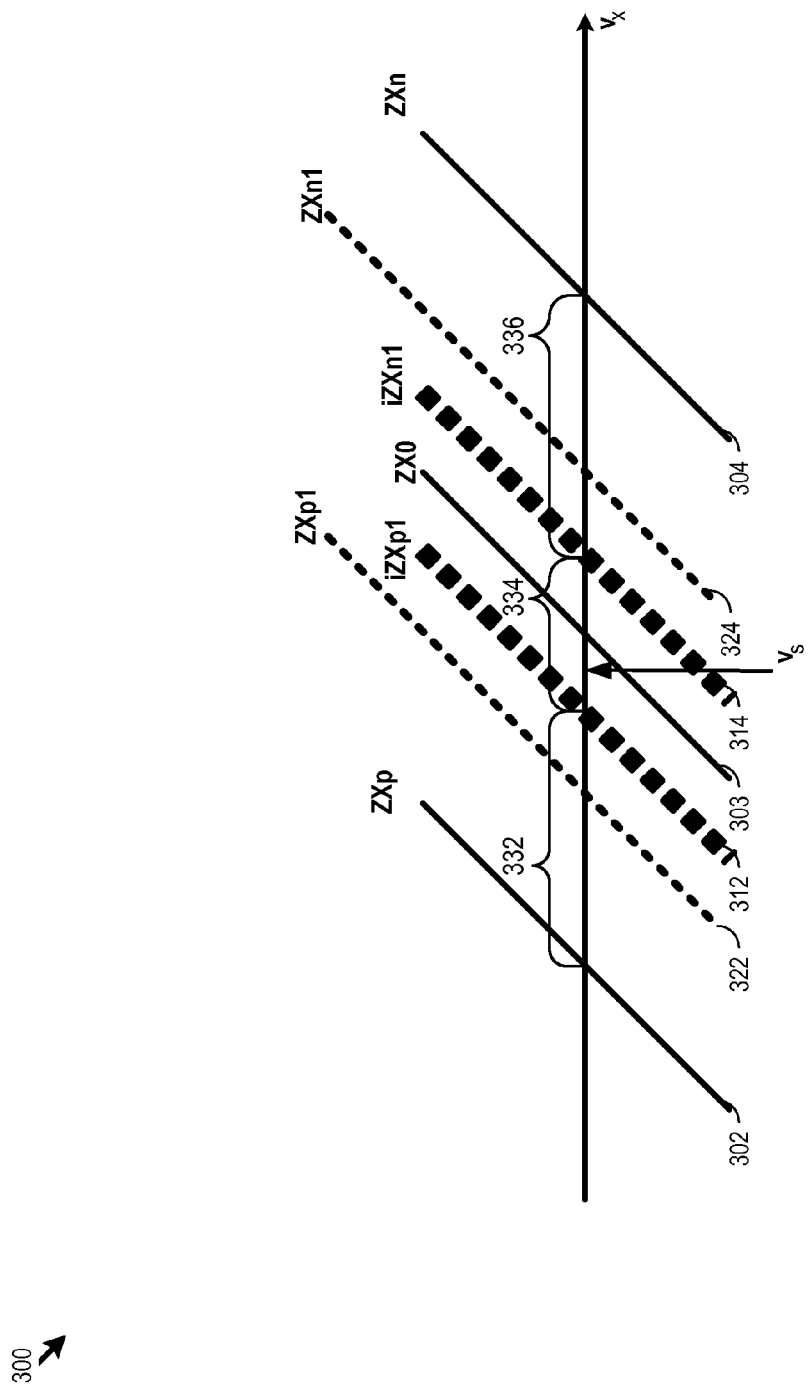
FIG. 3 shows example zero-crossing interpolation and selection logic.

FIG. 3 shows example zero-crossing interpolation and selection logic 300, which may be implemented in circuitry. Zero crossings ZXp 302 and ZXn 304 may be sampled from the SAR stage 210 of an MZADC 200. The sub-ranging circuitry 250 may generate interpolated zero crossings iZXp1 312 and iZXn1 314 from ZXp 302 and ZXn 304. The iZXp1 312 and iZXn1 314 divide the space between ZXp 302 and ZXn 304 into 3 regions 332, 334, 336. The ZX interpolation and selection circuitry 272 may identify which of the 3 regions 332, 334, and 336 contains $V_s$ and select the corresponding ZXs to be over-ranged for recursive sub-ranging. For example, region 334 between two zero crossings iZXp1 312 and iZXn1 314 may be identified to contain $V_s$. In this case, the corresponding over-ranged ZXs, ZXp1 322 and ZXn1 324, which are generated by interpolating between ZXp and ZXn, are fed as input to the succeeding sub-ranging stage 270. In the case that region 332 contains $V_s$, ZXp 302 and ZX0 303 are selected in place of ZXp1 and ZXn1, respectively, as input for subsequent sub-ranging.

Figure 4:
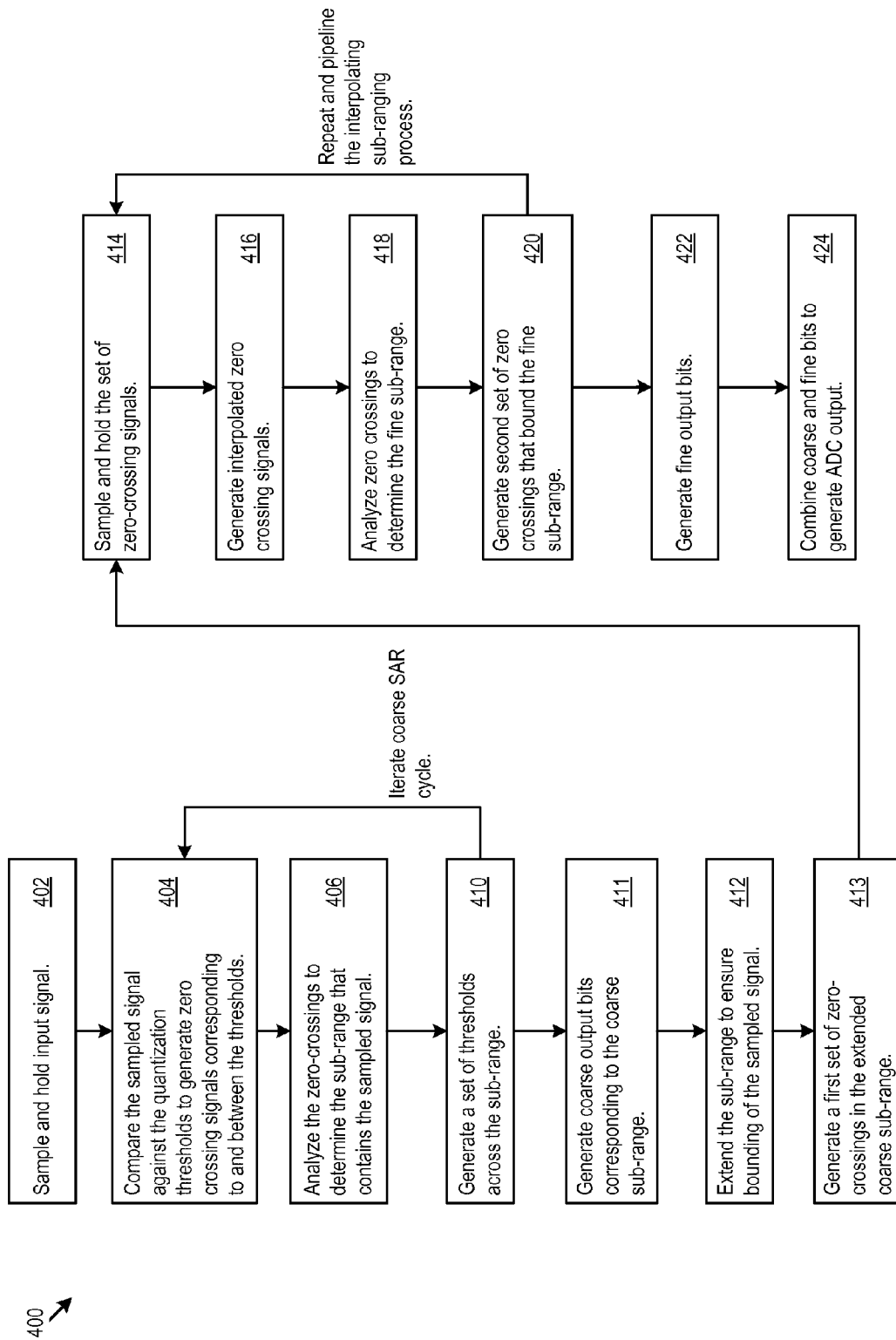
FIG. 4 shows example MZADC logic.

FIG. 4 shows example MZADC logic 400, which may be implemented on circuitry. The MZADC logic 400 may sample and hold an input signal and generate the initial set of quantization thresholds within the signal full scale (402). The signal may include a voltage, an optical signal, a current level, or other signal that may be quantized in an ADC. The input signal may be referenced against the quantization thresholds (e.g., sample voltage levels) to generate ZX signals corresponding to and between the thresholds (404). The ZXs may be detected using a latch/comparator system to identify the sub-range that contains the sampled signal $V_s$ (406). A set of thresholds across the sub-range may be generated to iterate the SAR conversion cycles (410). The SAR iterations generate additional coarse bits at the expense of conversion rate and latency. The bits encoding the identified sub-range in each cycle are registered as part of the MZADC output, and the sub-range identified in the last cycle is extended to ensure containing the sampled signal in presence of zero-crossing errors (411). The two or more zero crossings that bound the extended sub-range may be generated as input to subsequent sub-ranging conversion (412).

The input zero crossings may be sampled and held by the MZADC logic 400 (414) and then interpolated to generate one or more interpolated zero crossings (416). The zero crossings may be detected using a latch/comparator system to determine the new sub-range and the corresponding output bits (418). The output bits may be used to select a pair or set of zero crossings bounding the new sub-range with higher precision than those zero crossings from the SAR preamp outputs (420). The MZADC logic 400 may use the selected zero crossing signals as input for a subsequent pipelined iteration of the interpolating sub-ranging process (414). The MZADC logic may generate fine output bits (422). The MZADC logic may assemble the registered coarse and fine output bits to generate the ADC output (424).

In various implementations, bottom-plate sampling may be applied to overcome SH imperfections and auto-zeroing may be used to correct amplifier offsets. The new higher precision sub-range may produce finer bit outputs without necessarily relying on the accuracy of the gain slope of the SH amplifier. For example, instead of estimating the position of $V_s$ by relying on the rise or fall time of an amplifier, the MZADC logic may sample multiple interpolated ZXs. As long as the slopes of the individual ones of the ZXs are matched to one another, $V_s$ may fall between the two sampled ZXs with where the value of the sampled ZXs switches from positive to negative (e.g., a change in polarity is detected between two consecutive ZX signals). Thus, the zero crossing slopes or the gains of the ZX path preamps need not necessarily be accurate as long as they are matched. In addition, the SAR operation of the MZADC reduces the input range of the sub-ranging preamps. This may reduce the effects of the amplifier output ZX non-linearity on the interpolated ZXs in the sub-ranging ADC stage 250.

In various implementations, the total size of the multiple DAC's may be determined by the kT/C noise formula. In some cases, the MZADC architecture may be implemented with a smaller size spread among DAC capacitors than that of conventional SAR architectures of the same bit depth without sub-ranging. This may also allow for a comparative reduction in the size of unit cells and their associated layout routing.

In addition, the calibration of the offset corrections in the MZADC architecture may be performed in the analog domain. Analog calibration of offsets may be performed in less time and at much lower cost than the digital calibrations used to correct interleaved channel imbalance, inter-stage reference mismatch, residue amplifier gain error and incomplete settling, and/or other corrections performed for other ADC architectures. The MZADC architecture may be combined with other ADC architectures that use digital calibration to reduce the overall system calibration time.

The MZADC architecture multiplies the throughput with respect to conventional SAR ADCs using multi-bit successive approximation and pipelined sub-ranging. It may be used to implement efficient high-speed single channel ADCs to eliminate or reduce the complexity of conventional interleaved single-bit-cycle SAR ADCs.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:

1. A device comprising:
   sampling circuitry configured to sample an input signal;
   successive approximation register (SAR) circuitry configured to:
   responsive to an iteration of a comparison of quantization thresholds with the input signal, determine a coarse sub-range bounding the input signal and a set of coarse output bits corresponding to the coarse sub-range; and
   after the iterations, determine a first set of zero crossing (ZX) signals responsive to the comparison of the quantization thresholds and the input signal; and
   sub-ranging circuitry coupled to an output of the SAR circuitry, the sub-ranging circuitry configured to:
   responsive to the first set of ZX signals, determine first interpolated ZX signals;
   detect a polarity change between consecutive ones of the first interpolated ZX signals;
   responsive to the polarity change, determine fine output bits; and
   combine the coarse and fine output bits to generate an analog-to-digital converter (ADC) output.

2. The device of claim 1, where the SAR circuitry is further configured to:
   adjust the quantization threshold thresholds and offsets for the first set of ZX signals.

3. The device of claim 1, where the SAR circuitry is configured to generate the first set of ZX signals via interpolation.

4. The device of claim 1, where the SAR circuitry is configured to match gain slopes of the first set of ZX signals to one another.

5. The device of claim 1, where the SAR circuitry is configured to adjust the quantization thresholds by applying a digital input to a digital-to-analog converter.

6. The device of claim 1, where the sub-ranging circuitry is configured to generate a second set of ZX signals by interpolating the first set of ZX signals responsive to the fine output bits.

7. The device of claim 6, where the sub-ranging circuitry comprises a sample-and-hold (SH) circuitry configured to sample the first set of ZX signals before determining the first interpolated signals.

8. The device of claim 7, where the SH circuitry comprises amplifiers with matched zero-crossing gain slopes.

9. The device of claim 6, where the sub-ranging circuitry comprises comparators configured to determine whether the input signal falls among the second set of ZX signals by a detecting polarity change in consecutive ZX signals among the second set of ZX signals.

10. The device of claim 6, where the sub-ranging circuitry is configured to apply over-ranging to the second set of ZX signals by selecting interpolated ZX signals that are further apart than a selected sub-range.

11. The device of claim 1, where:
the sub-ranging circuitry is configured to perform an iteration by: interpolating the first set of ZX signals to determine a second set of ZX signals; and
selecting a third set of ZX signals from among the second set of ZX signals.

12. A method comprising:
sampling an input signal;
responsive to successive approximation of the input signal in a sub-range;
determining coarse output bits; determining a first set of zero crossing (ZX) signals responsive to a comparison of sub-range quantization thresholds with the input signal;
interpolating the first set of ZX signals to determine interpolated ZX signals;
responsive to a polarity change between consecutive ZX signals among the interpolated ZX signals;
determining fine output bits; and
combining the coarse and fine output bits to generate an analog-to-digital converter (ADC) output.

13. The method of claim 12, further comprising adjusting the sub-range quantization thresholds for over-range and offset correction.

14. The method of claim 12, further comprising generating the first set of ZX signals by performing interpolation on an initial pair of ZX signals within the first set of ZX signals.

15. The method of claim 12, where the first set of ZX signals have matched gain slopes.

16. The method of claim 15, generating the ZX signals using parallel amplifier paths to produce the matched gain slopes.

17. The method of claim 12, further comprising generating and adjusting a quantization threshold by applying a digital input to a digital-to-analog converter.

18. A device comprising:
an analog-to-digital converter (ADC) comprising:
an input comprising first sample-and-hold (SH) circuitry configured to produce a sample of an input signal;
successive approximation register (SAR) circuitry coupled to the input, the SAR circuitry configured to:
compare the sample to a first quantization threshold and a second quantization threshold to determine a coarse output bit;
responsive to the coarse output bit determine a first pair of ZX signals; and
sub-ranging circuitry coupled to an output of the SAR circuitry, the sub-ranging circuitry configured to:
interpolate the first pair of ZX signals to determine interpolated ZX signals;
detect a polarity change between consecutive ZX signals among the interpolated ZX signals;
responsive to the polarity change, determine a fine output bit; and
combine the coarse bit and fine output bit to generate an analog-to-digital converter (ADC) output.

19. The device of claim 18, where:
the sub-ranging circuitry comprises:
parallel amplifier paths configured to amplify the interpolated ZX signals, the parallel amplifier paths configured to operate in an open-loop control mode; and
second sample-and-hold (SH) circuitry configured to generate ZX samples by sampling interpolated ZX signals during amplification.

20. The device of claim 18, where the sub-ranging circuitry is configured to determine more than one fine output bit responsive to the polarity change.

* * * * *